United States Patent [19]

Sakai et al.

[11] Patent Number: 4,609,835
[45] Date of Patent: Sep. 2, 1986

[54] SEMICONDUCTOR INTEGRATED CIRCUIT

[75] Inventors: Yoshio Sakai; Toshiaki Masuhara, both of Hachioji; Osamu Minato, Kokubunji; Toshio Sasaki, Hachioji, all of Japan

[73] Assignee: Hitachi, Ltd., Tokyo, Japan

[21] Appl. No.: 471,130

[22] Filed: Mar. 1, 1983

Related U.S. Application Data

[63] Continuation of Ser. No. 96,684, Nov. 23, 1979, abandoned.

[30] Foreign Application Priority Data

Nov. 24, 1978 [JP] Japan .............. 53-160710[U]

[51] Int. Cl.$^4$ .............. G11C 11/40; H01L 29/78; H01L 27/04; H03K 19/094
[52] U.S. Cl. .............. 307/450; 357/22; 357/23.4; 357/41; 357/42; 357/51; 357/59; 357/20; 365/154
[58] Field of Search .............. 357/42, 23.4, 22, 20, 357/41, 51, 59; 365/154; 307/450

[56] References Cited

U.S. PATENT DOCUMENTS

| | | |
|---|---|---|
| 3,821,776 | 6/1974 | Hayashi et al. .............. 357/23 VD |
| 4,089,022 | 5/1978 | Asai et al. .............. 357/41 |
| 4,092,735 | 5/1978 | McElroy .............. 357/41 |
| 4,125,854 | 11/1978 | McKenny et al. .............. 357/41 |

FOREIGN PATENT DOCUMENTS 52-36986  3/1977  Japan .............. 357/41

OTHER PUBLICATIONS

Gaensslen et al., *IBM Tech. Discl. Bulletin*, vol. 13, No. 2, Jul. 1970, pp. 302–303.
Dennard et al., *IBM Tech. Discl. Bull.*, vol. 11, No. 6, Nov. 1968, pp. 592–593.
Yoshida et al., *IEEE J. of Solid State Circuits*, vol. SC 11, No. 4, Aug. 1976, "High Power MOSFET".

*Primary Examiner*—William D. Larkins
*Attorney, Agent, or Firm*—Antonelli, Terry & Wands

[57] ABSTRACT

Disclosed is a semiconductor integrated circuit which comprises an n-type silicon substrate, a p-type well region having an opening at a part thereof, which is formed on the surface portion of the substrate, an MOS transistor formed in the p-type region and a resistance layer extended from the drain region of the MOS transistor to the opening of the p-type well region through a insulating film formed on the surface of the substrate, in which the drain region of the MOS transistor is electrically connected to the silicon substrate through the resistance layer so that a current is supplied to the MOS transistor.

17 Claims, 24 Drawing Figures

SEMICONDUCTOR INTEGRATED CIRCUIT

This is a continuation of application Ser. No. 96,684, filed Nov. 23, 1979, now abandoned.

BACKGROUND OF THE INVENTION (1) Field of the Invention

The present invention relates to a semiconductor integrated circuit. More particularly, the present invention relates to the power supply path for a semiconductor integrated circuit.

(2) Description of the Prior Art

FIG. 1 is a circuit diagram illustrating the structure of a memory cell of a static memory comprising an insulated gate field effect transistor (hereinafter referred to as "MOS transistor"), which is one example of a conventional semiconductor integrated circuit. The memory cell circuit shown in FIG. 1 comprises as a main member a flip-flop circuit in which a polycrystalline silicon layer of a high resistivity of $10^{10}$ to $10^{12}$ $\Omega$ is used as the load resistance. Referring to FIG. 1, the memory cell comprises MOS transistors T1 and T2 for switching the flip-flop circuit, resistances R1 and R2 for supplying a current to the MOS transistors T1 and T2 from a power supply line 1, a ground line 2 connected to sources of the MOS transistors T1 and T2, gate-switching transistors T3 and T4 connecting data lines 3 and 4 to the flip-flop and a word line 5 connected to gates of the MOS transistors T3 and T4. In the conventional cell where polycrystalline silicon layers of a high resistivity of $10^{10}$ to $10^{12}$ $\Omega$ are used as the resistances R1 and R2, as shown in FIG. 2, a polycrystalline silicon layer 8 (i-layer) of a high resistivity is formed over a silicon substrate 6 on an $SiO_2$ film 7, and one end of this layer 8 is connected to a predetermined region of substrate 6 through a layer 9 of the n+ type and the other end of the layer 8 is connected to a power supply line 1 through a layer of the n+ type. By virtue of a current flowing through the high-resistivity polycrystalline layer 8, destruction of memory information by leakage currents of the MOS transistors T1 and T2 shown in FIG. 1 is prevented. In the conventional memory cell shown in FIG. 1, there are one power supply line, one ground line, a total of two data lines and one word line, that is, five lines. Disposition of these many lines results in an increase in the area of the memory cell and is not preferred from the viewpoint of packing density. Furthermore, the presence of the high-resistivity polycrystalline silicon layer is another cause of an increase in the area of the memory cell.

SUMMARY OF THE INVENTION

It is a primary object of the present invention to provide a semiconductor integrated circuit having a high packing density, in which the defects involved in conventional semiconductor integrated circuits are eliminated. More particularly, an object of the present invention is to provide a semiconductor integrated circuit in which the power supply line is omitted and the number of lines is reduced.

In accordance with the present invention, the above-mentioned object is attained by a structure in which the semiconductor substrate is used as the power supply line and a voltage (current) is supplied from this semiconductor substrate. For example, in a static MOS memory cell as shown in FIG. 1, the structure of the present invention is characterized in that a small current is supplied from the semiconductor substrate to compensate for a leakage current of an MOS transistor. More specifically, in the semiconductor integrated circuit according to the present invention, a well region of a conductivity type opposite to that of the substrate is formed on the surface region of the semiconductor substrate and elements such as MOS transistors are arranged in this well region, and the substrate is connected to a power source and the elements in the well region are electrically connected to the substrate to supply a voltage (current) form the power source to the respective elements from the substrate.

DETAILED DESCRIPTION OF THE PREFERRED EMBODIMENTS

The present invention will now be described in detail with reference to the following embodiments.

Embodiment 1

Figure 1:
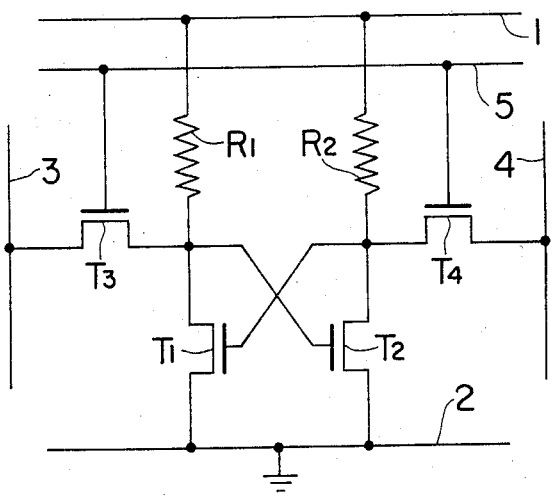
FIG. 1 is a circuit diagram of a conventional static MOS memory cell.
Figure 2:
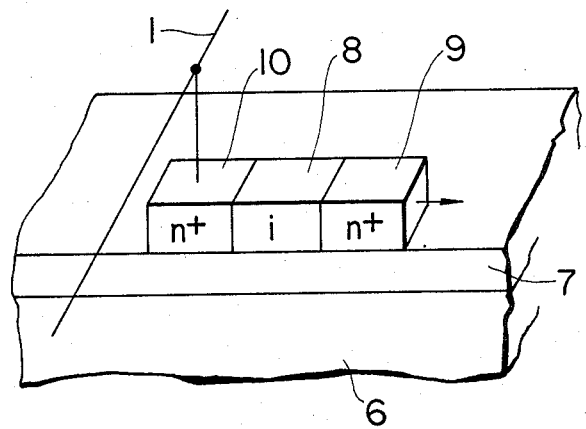
FIG. 2 is a conceptual diagram illustrating the layout of lines in the memory cell shown in FIG. 1 where a polycrystalline silicon layer of a high resistivity is used as a resistance.
Figure 3:
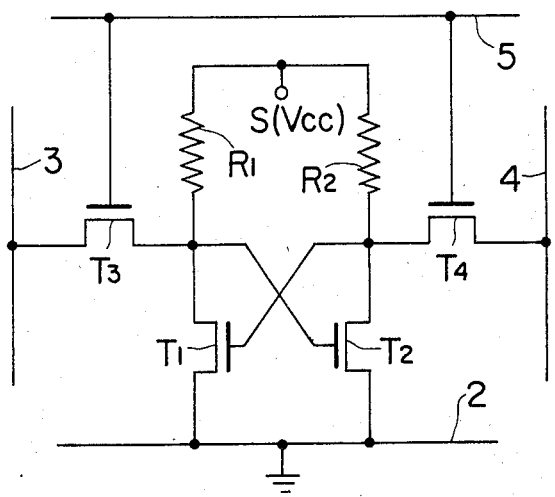
FIG. 3 is a circuit diagram of an MOS memory cell according to one embodiment of the present invention.
Figure 4:
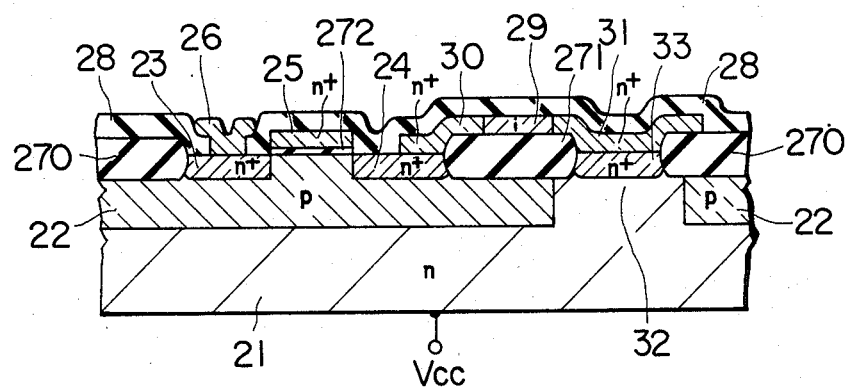
FIG. 4 is a sectional partial view illustrating the structure in the integrated circuit of the MOS memory cell shown in FIG. 3.

A static MOS memory cell of this embodiment is shown in the circuit diagram of FIG. 3. As in the conventional memory cell shown in FIGS. 1 and 2, polycrystalline silicon (Si) layers of a high resistivity are used as resistances R1 and R2 in this embodiment, but this embodiment is different from such a conventional memory cell in that one end of the polycrystalline Si layer to be connected to the power supply line is connected to a semiconductor substrate S biassed by a power source voltage as indicated by an arrow through a layer of the n+ type. Accordingly, the power supply line 1 as shown in FIG. 1 and FIG. 2 need not be laid out and the area of the memory cell can be reduced. FIG. 4 is a diagram illustrating the sectional structure of an MOS transistor T1 or T2 and the resistance R1 or R2 composed of the high-resistivity polycrystalline Si layer in the memory cell shown in FIG. 3. This embodiment will now be described with reference to an n-channel MOS transistor memory cell as an example.

All the MOS transistors are formed in a p-type well region 22 biassed by a zero or negative voltage, which has an impurity concentration of $10^{15}$ to $10^{16}$ cm$^{-3}$ and is formed on the surface of an n-type silicon substrate 21 having a low impurity concentration of about $10^{14}$ to about $10^{16}$ cm$^{-3}$. The n-type Si substrate 21 is biassed by the supply voltage Vcc. Reference numerals 23 to 26 represent an n+ region acting as the source, an n+ region acting as the drain, an n+ polycrystalline silicon layer acting as the gate and a source electrode composed of Al, respectively. Reference numerals 270 and 271 represent SiO$_2$ films for isolation and reference numeral 272 represents a gate insulator (SiO$_2$ film). Reference numeral 28 represents a phosphosilicate glass film (PSG film). A high-resistivity polycrystalline silicon layer 29 for supplying a small current is formed on the SiO$_2$ film 271 being in contact with the end portion of the drain 24. One end of the Si layer 29 is connected to the drain 24 through an n+ type polycrystalline silicon layer 30 and an n+ type polycrystalline silicon layer 31 is formed on the other end of the Si layer 29. The n+ polycrystalline Si layer 31 is connected to an n+ region 33 formed on the surface portion of an opening 32 formed on a part of the p-type well region 22 and extended to the surface of the substrate 21. Accordingly, a small current for compensating the leakage current of the MOS transistor is supplied to the drain region 24 of the MOS transistor through the high-resistivity polycrystalline Si layer 29 from the n-type Si substrate 21 biassed by the supply voltage.

Figure 5:
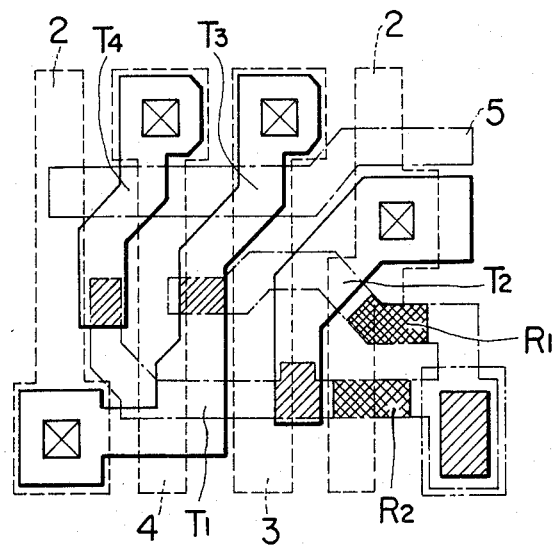
FIGS. 5 and 6 are plan views showing the layout pattern in the integrated circuit of the memory cell shown in FIG. 3.
Figure 6:
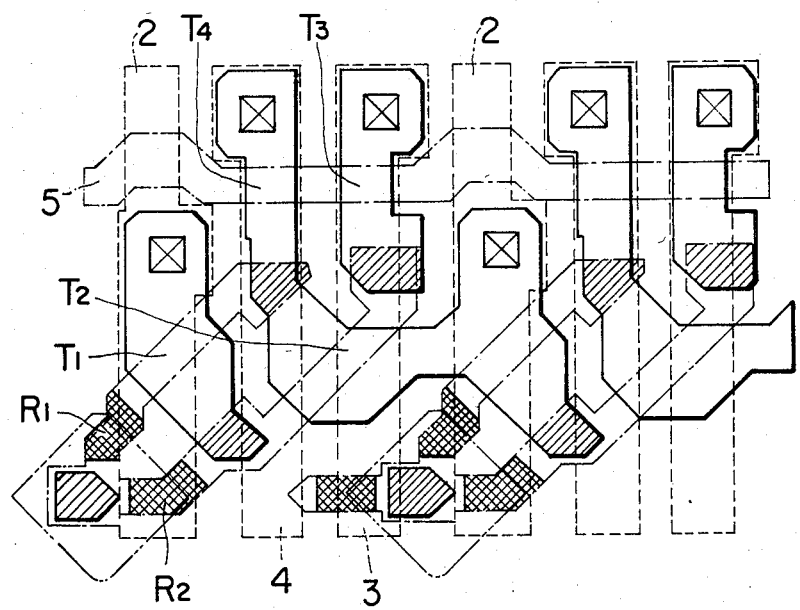

FIGS. 5 and 6 are diagrams illustrating examples of the planar structure of the static MOS memory cell according to the present embodiment.

Referring to FIGS. 5 and 6, the region indicated by solid lines is an n+ type diffusion layer, region indicated by one-dot chain lines is an n+ type polycrystalline Si layer, the region indicated by dotted lines is an Al line layer, the hatched region is a contact region between the n+ type diffusion layer and polycrystalline Si layer, and the region indicated by mesh lines is a high-resistivity polycrystalline Si layer (i-layer). The mark indicates a contact hole of the diffusion layer and the region indicated by two-dotted chain lines is an opening of the p-type region. Portions and elements corresponding to those shown in FIG. 5 are represented by the same reference numerals and symbols as used in More specifically, T1 and T2 represent MOS transistors constituting a flip-flop, and T3 and T4 represent gate-switching MOS transistors. R1 and R2 represent polycrystalline silicon layers of high resistivity. Reference numerals 2, 3, 4 and 5 represent a ground line, a data line, another data line and a word line, respectively. Since a power supply line is not laid out as pointed out hereinbefore, the area of this memory cell is 60 to 70% of the area of the conventional memory cell shown in FIG. 1 and the packing density can be increased. Since the size of the opening of the p-type region connecting the high-resistivity polycrystalline Si layer to the n-type silicon substrate should be at least 2 times the sum of the depth of the p-type region and the length of a depletion layer extended from the p-type region to the n-type substrate, in order to prevent an increase in the area of the memory cell, it is preferred that the depth of the p-type region be decreased to such an extent that will not degrade other characteristics such as the breakdown voltage. For example, when the depth of the p-type region is 3 to 4 $\mu$m, the opening of the p-type region has preferably a square shape having a one side length of 10 to 15 $\mu$m.

Figure 7:
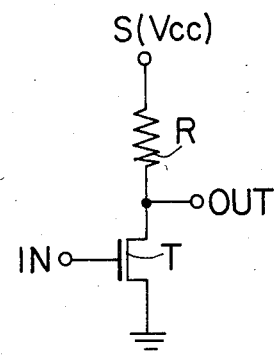
FIG. 7 is a circuit diagram illustrating an inverter circuit according to another embodiment of the present invention.

If an appropriate resistance value is selected for the polycrystalline Si layer in the structure shown in FIG. 4, the structure can be used as an inverter comprising and MOS transistor T and a load resistance R as shown by an equivalent circuit diagram of FIG. 7. Also in this case, a power supply line need not be laid out and an inverter having a reduced area can be provided.

The process for the fabrication of the memory cell structure of the present embodiment shown in FIG. 4 will now be described with reference to FIGS. 8A, 8B, 8C, 8D and 8E.

Figure 8A:
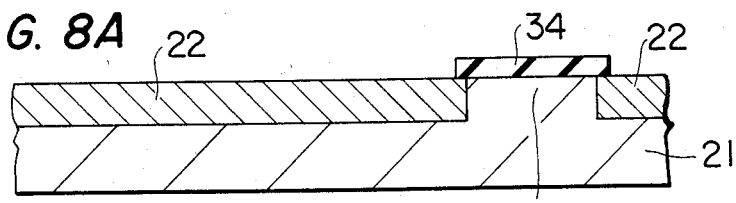
FIGS. 8A, 8B, 8C, 8D and 8E are sectional views illustrating the steps of the process for the fabrication of the memory cell structure shown in FIG. 4.

As shown in FIG. 8A, an SiO$_2$ film 34 having a predetermined pattern and a thickness of 0.5 to 0.8 $\mu$m is formed at a portion corresponding to the opening of the p-type region on the surface of an n-type silicon substrate 21 having a low impurity concentration of about $5 \times 10^{14}$ cm$^{-3}$ by a photoetching process. A p-type impurity such as boron is incorporated into the n-type substrate 21 by thermal diffusion at 1200° C. for 3 to 5 hours while using the SiO$_2$ film 34 as the mask, whereby a p-type region 22 (p-type well region) having a low impurity concentration of $10^{15}$ to $10^{16}$ cm$^{-3}$ and a depth of 3 to 4 $\mu$m is formed.

Figure 8B:
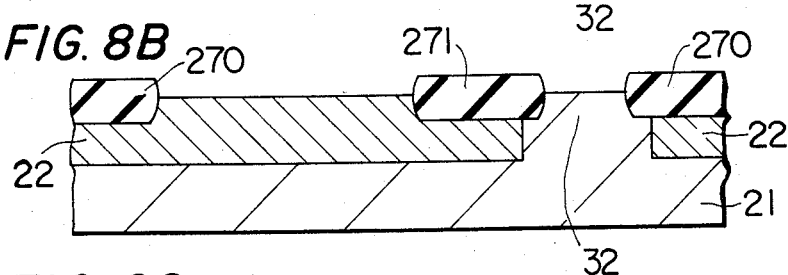

Next, referring to FIG. 8B, after the SiO$_2$ film 34 on the silicon substrate 21 has been completely removed, thick field SiO$_2$ films 270 and 271 having a thickness of about 1 $\mu$m are formed, except at the MOS transistor-forming region, by to the local oxidation process (see FIG. 8-B). For this step, an arrangement is made such that the field SiO$_2$ film is not formed on the opening 32 of the p-type well region. Then, a thin gate SiO$_2$ film 272 is formed by a thermal oxidation process or the like. The gate SiO$_2$ film 272 is removed at the opening 32 of the p-type well region and a part of the p-type well region 22.

Figure 8C:
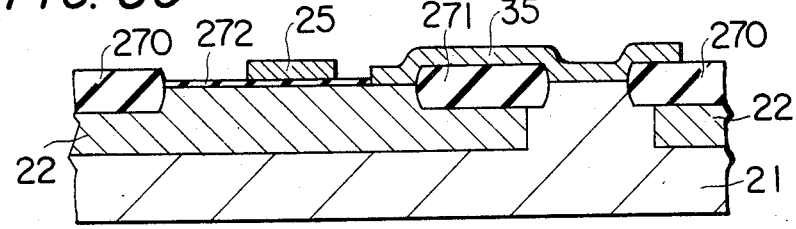

As show in FIG. 8C, a polycrystalline silicon layer having a sheet resistance of 10$^8$ to 10$^{12}$ Ω/□ and a thickness of 300 to 500 nm is deposited and a gate 25 and a polycrystalline silicon layer 35 are formed by photo etching of the so deposited polycrystalline silicon layer.

Figure 8D:
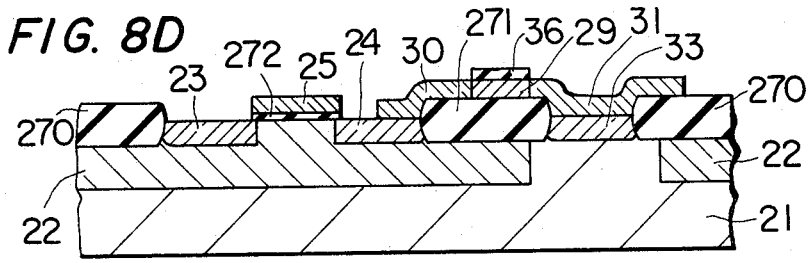

Next, as illustrated in FIG. 8D, SiO$_2$ film 36 having a thickness of 100 to 300 nm is formed on the region to be formed into a high-resistivity polycrystalline silicon layer within polycrystalline silicon layer 35 by the thermal oxidation or chemical vapor deposition, and an n-type impurity such as phosphorus or arsenic is incorporated at a high concentration exceeding 10$^{20}$ cm$^{-3}$ by ion implantation or thermal diffusion to form a source region 23 and a drain region 24. At this step, within the polycrystalline silicon layer 35, the portion below the SiO$_2$ film 36 is left as a high-resistivity region 29 and portions on both the sides of the region 29 are formed into heavily doped n-type regions 30 and 31. One end of the highresistivity region 29 is electrically connected to the drain region 24 through the ntype region 30 and the other end is electrically connected to the n-type silicon substrate through the n+ type region 31.

Figure 8E:
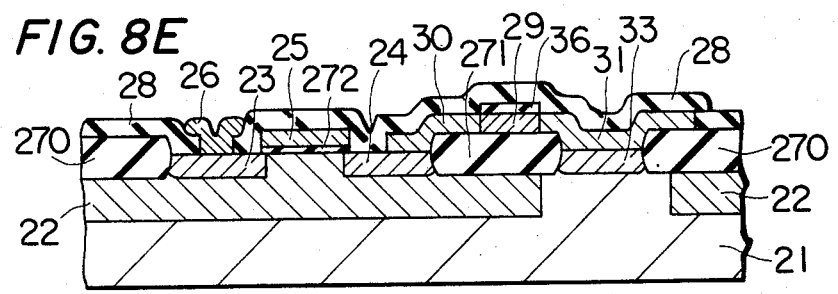

Then, as show in FIG. 8E a PSG film 28 is formed on the entire surface, and a contact hole is formed and an Al electrode is attached, whereby a cell structure as shown in FIG. 4 is obtained.

Embodiment 2

In the above-mentioned embodiment 1, an opening is formed at a part of the p-type well region 22 and is used as a passage for supplying a current from the silicon substrate 21 to the high-resistivity polycrystalline silicon layer 29. When the size of this opening is further reduced so that the depletion layer extended from the p-type well region to the n-type silicon substrate 21 covers the entirety of the opening 32, current flowing from the silicon substrate 21 to the high impurity concentration n-type region 33 in the opening 32 can be controlled by the length of the depletion layer. In other words, there can be formed an n-channel junction-gate field effect transistor (hereinafter referred to as a "J-FET") in which the n-type silicon substrate 21 acts as the drain, the p-type well region acts as the gate and the high impurity concentration n-type region 33 in the opening 32 acts as the source. A current for compensating leakage current of the MOS transistor in the memory cell flows through this J-FET. A static MOS memory cell based on this new principle is shown in the circuit diagram of FIG. 9.

In the present embodiment, n-channel J-FETs F1 and F2 are used instead of the resistances of the high-resistivity polycrystalline silicon layer used in the above-mentioned embodiment 1, and current is supplied from the silicon substrate S by these J-FETs F1 and F2. These J-FETs F1 and F2 are formed below the drain regions of n-channel MOS transistors. Since a power supply line need not be laid out, the area of the static MOS memory cell of the present embodiment is smaller than not only the area of the conventional memory cell shown in FIG. 1, but also the area of the memory cell of the above-mentioned embodiment 1 shown in FIG. 3. Accordingly, the present embodiment 2 is especially preferred from the viewpoint of the packing density.

Figure 10:
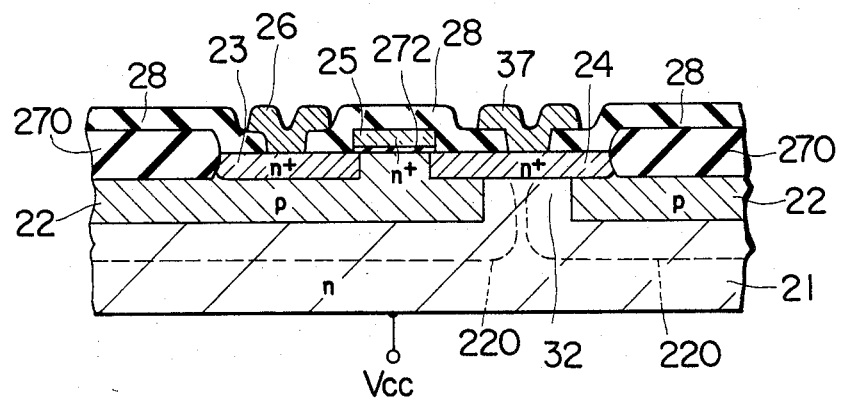
FIG. 10 is a sectional partial view illustrating the structure in the integrated circuit of the MOS memory cell shown in FIG. 9.

FIG. 10 illustrates the sectional structure of the MOS transistor T1 or T2 and the J-FETs F1 or F2 in the present embodiment 2. In FIG. 10, reference numerals 21, 22, 32 and 25 represent an n-type silicon substrate, a p-type well region, an opening of the p-type well region and an n+ type polycrystalline silicon layer acting as the gate, respectively. Reference numerals 270 and 272 represent an SiO$_2$ film and a gate-insulating SiO$_2$ film, respectively. Reference numeral 28 represents a PSG film and reference numerals 23 and 24 represent the source and drain of the MOS transistor, respectively. Reference numerals 26 and 37 represent Al electrodes, and reference numeral 220 represents a depletion layer. Referring to FIG. 10, the opening 32 of the low impurity concentration p-type region is formed below the drain 24 which is the highly doped n-type region in the n-channel MOS transistor, and this opening constitutes a channel region of the n-channel J-FET where the n-type substrate 21 is used as the drain. The drain 24 of the MOS transistor also acts as the source of the J-FET. Accordingly, the J-FET is formed below the MOS transistor and the area of the memory cell only of the present embodiment is the area of the MOS transistor.

Figure 9:
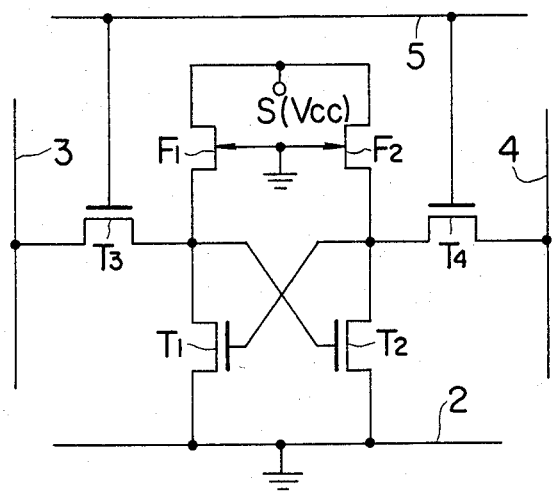
FIG. 9 is a circuit diagram illustrating an MOS memory cell according to still another embodiment of the present invention.
Figure 11:
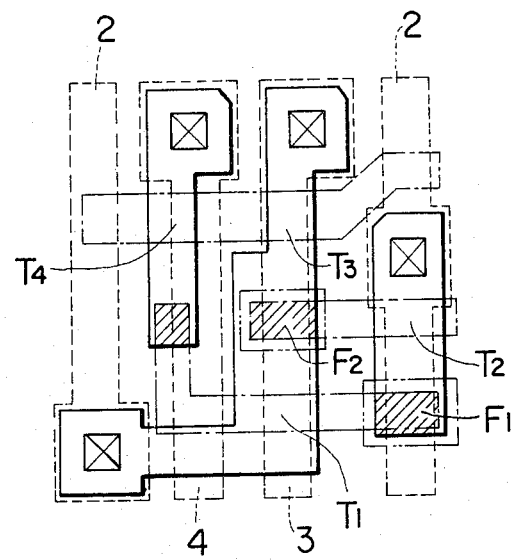
FIG. 11 is a plan view showing the layout pattern in the integrated circuit of the MOS memory cell shown in FIG. 9.

FIG. 11 is a diagram illustrating one example of the planar structure of the static MOS memory cell according to the present embodiment. Respective regions are indicated in the same manner as in FIG. 5, and portions corresponding to those shown in FIG. 9 are represented by the same reference numerals and symbols as used in FIG. 9. Since the J-FET for supplying a small current is formed below the MOS transistor as pointed out hereinbefore, the entire planar area of the memory cell is occupied only by four MOS transistors. Accordingly, the area of the memory cell of the present embodiment is 40 to 50% of the area of the conventional memory cell shown in FIG. 1. It is preferred that the size of the channel region of the J-FET, that is, the size of the opening of the p-type well region, be about 2 times the sum of the depth of the p-type well region and the length of the depletion layer extended from the p-type well region to the n-type substrate. For example, when the depth of the p-type well region is 3 to 4 μm, the opening of the p-type region has preferably a square shape having one side length of 6 to 10 μm.

Figure 12:
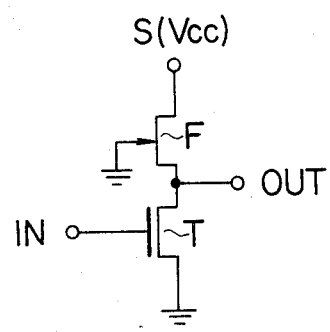
FIG. 12 is a circuit diagram illustrating an inverter circuit according to still another embodiment of the present invention.

In the structure shown in FIG. 10, if the mutual conductance of the J-FET, that is, the size of the opening of the p-type region, is appropriately chosen, there can be formed an inverter which comprises J-FET F and MOS transistor T in which the J-FET F is used as the load, as shown by an equivalent circuit diagram of FIG. 12. In this case, one inverter can be formed on the plane area corresponding to the area of one MOS transistor, and therefore, an inverter having an extremely small area can be provided.

The process for the fabrication of the MOS memory cell according to the present embodiment will now be described with reference to FIGS. 13A, 13B, 13C, 13D, and 13E.

Figure 13A:
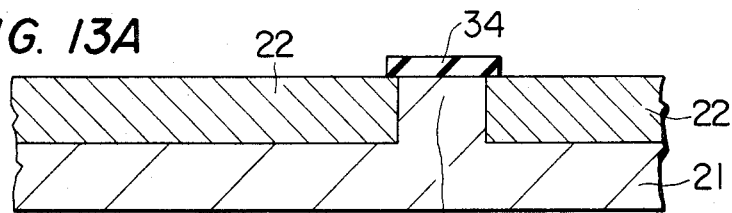
FIGS. 13A, 13B, 13C, 13D and 13E are sectional views illustrating the steps of the process for the fabrication of the memory cell structure shown in FIG. 10.

As show in FIG. 13A, an SiO₂ film 34 having a predetermined pattern and a thickness of 0.5 to 0.8 $\mu$m is formed at a part corresponding to the opening of the p-type region on the surface of a silicon substrate having a lower impurity concentration of about $5 \times 10^{14}$ cm$^{-3}$ by a photo etching process. A p-type impurity such as boron is incorporated into the n-type substrate 21 by thermal diffusion at 1200° C. for 3 to 5 hours while using the SiO₂ film 34 as the mask, to form a lowly doped p-type well region 22 having an impurity concentration of $10^{15}$ to $10^{16}$ cm$^{-3}$ and a depth of 3 to 4 $\mu$m.

Figure 13B:
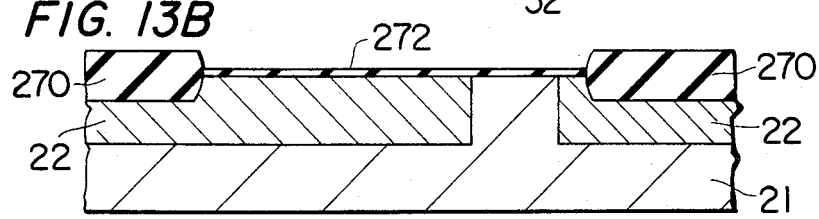

Next, as shown in FIG. 13B, after the SiO₂ film 34 on the surface of the silicon substrate 21 has been completely removed, a thick field SiO₂ film 270 having a thickness of about 1 $\mu$m is formed by a local oxidation process. Then, a thin gate SiO₂ film 272 having a thickness of 50 to 100 nm is formed.

Figure 13C:
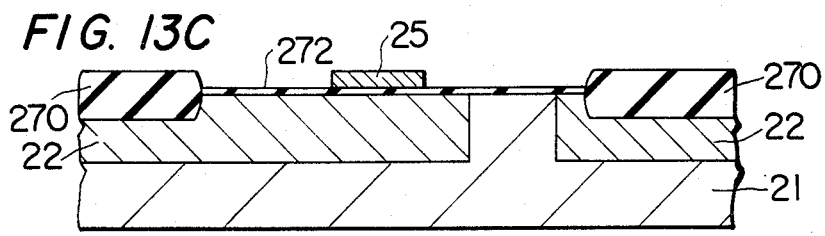

Following this step, as shown in FIG. 13C, a polycrystalline silicon layer having a thickness of 300 to 500 nm is deposited on the SiO₂ film 272, and a gate 25 is formed on a predetermined portion of the p-type well region 22 by the photo etching process.

Figure 13D:
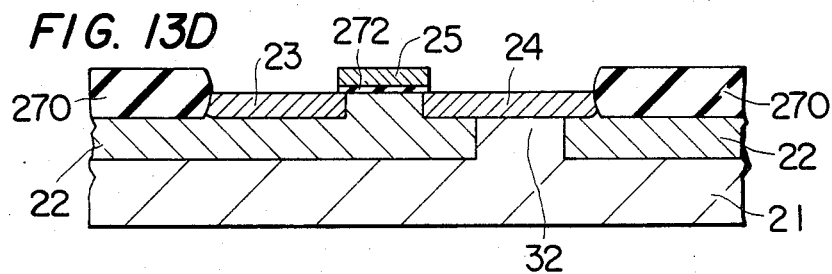

Then, as illustrated in FIG. 13D, the SiO₂ film 272 exposed at the surface is removed and an n-type impurity such as phosphorus or arsenic is incorporated at a high concentration exceeding $10^{20}$ cm$^{-3}$ by thermal diffusion or ion implantation to form a source region 23 and a drain region 24. At this step, an arrangement is made such that the drain region 24 of the MOS transistor extends to the opening 32 of the p-type well region.

Figure 13E:
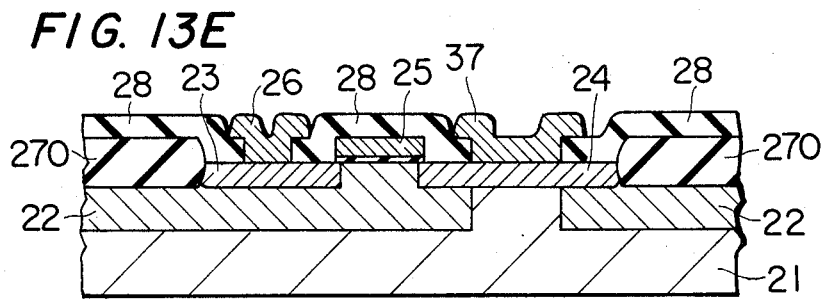

Finally, as shown in FIG. 13E, a PSG film 28 having a thickness of 0.5 to 1.0 $\mu$m is formed on the entire surface, and contact holes are formed and Al electrodes 26 and 37 are attached, whereby a cell having a structure shown in FIG. 9 is obtained.

Figure 14:
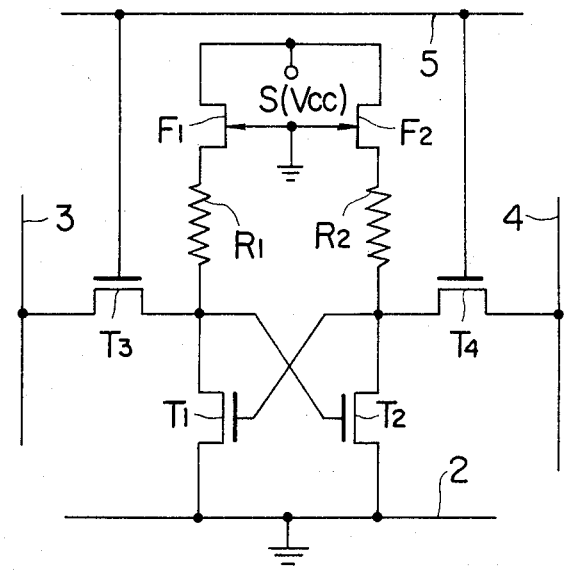
FIGS. 14 and 15 are circuit diagrams illustrating MOS memory cells according to still another embodiments of the present invention.

As a structure intermediate between the structure of the embodiment 1 and the structure of the embodiment 2, there can be obtained a structure in which as the resistances for supplying a small current, high-resistivity polycrystalline silicon layers R1 and R2 and J-FETs F1 and F2 formed in the opening of the p-type well region are used and the silicon layers R1 and R2 are connected in series to the J-FETs F1 and F2 as shown in FIG. 14. This structure is realized by selecting a size intermediate between the size of the opening in the embodiment 1 and the size of the opening in the embodiment 2 for the opening of the p-type well region. This structure is characterized in that the small current flowing through the high-resistivity polycrystalline silicon layer has a positive temperature coefficient such that the small current increases with elevation of temperature, but the small current flowing through the J-FET has a negative temperature coefficient such that the small current decreases with elevation of temperature. Accordingly, if the high-resistivity polycrystalline silicon layer is connected in series to the J-FET, a small current which hardly changes depending on the temperature change can be obtained.

Figure 15:
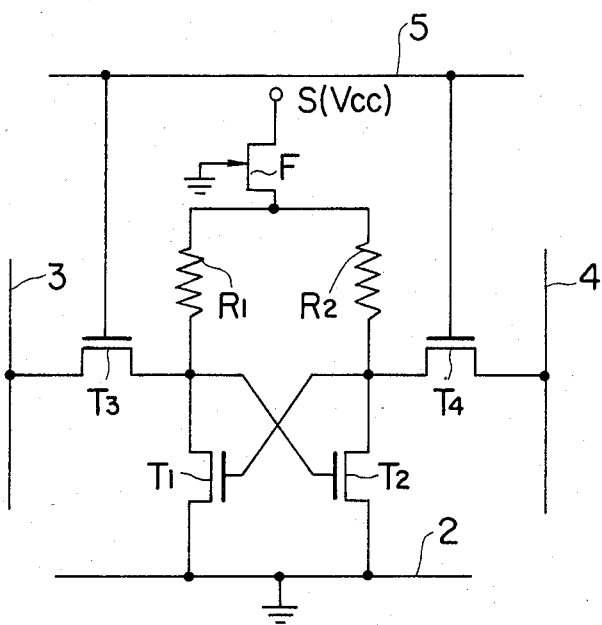

FIG. 15 illustrates a structure of a memory cell in which one J-FET F alone is used. In this embodiment, since the J-FET can be used commonly with the adjacent cell, the packing density can be improved over the packing density obtained in the embodiment shown in FIG. 14.

Figure 16:
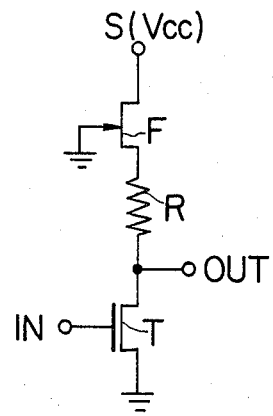
FIG. 16 is a circuit diagram illustrating an inverter circuit according to still another embodiment of the present invention.

FIG. 16 illustrates a circuit of an inverter in which a resistance R is connected in series to J-FET and they are used as the load.

As will be apparent from the above explanation, according to the present invention, the number of lines can be reduced and there can be provided a semiconductor integrated circuit, such as a static MOS memory cell or an inverter circuit, in which the packing density can be remarkably improved. Therefore, very excellent technical effects can be attained according to the present invention.

What is claimed is

1. A semiconductor integrated circuit comprising:
   a semiconductor substrate of a first conductivity type;
   a well region of a second conductivity type opposite to the conductivity type of the substrate, which is formed by selective impurity doping in the surface portion of the substrate except at an opening portion surrounded by said well region which is not subjected to said selective impurity doping so that said opening portion has a lower impurity concentration than the impurity concentration of the well region;
   a first insulated gate field effect transistor formed within the well region;
   a connecting layer extended from a drain of said first insulated gate field effect transistor to said opening of said well region via an insulating film formed on the surface of said substrate, wherein the contact between the connecting layer and said opening of said well region is an ohmic contact and said drain region is electrically connected through said connected layer;
   wherein said drain is connected to the semiconductor substrate in the portion of said opening through a resistance composed of polycrystalline silicon, which is formed on an insulating film formed on the substrate;
   wherein said resistance composed of polycrystalline silicon includes a first low-resistivity region connected to said drain, a second low-resistivity region connected to the semiconductor substrate in the portion of said opening and a high-resistivity region interposed between said first and second low-resistivity regions;
   wherein a heavily doped region of the first conductivity type is formed on the surface region of the semiconductor substrate in the portion of said opening and said second low-resistivity region is connected to said heavily doped region; and
   wherein a junction-gate field effect transistor is constructed by said heavily doped region, said semiconductor substrate, the semiconductor substrate in the portion of said opening and said well region, which acts as the source, drain, channel and gate, respectively.

2. A semiconductor integrated circuit as set forth in claim 1 wherein the width of said opening is about 2 times the sum of the depth of the well region and the length of a depletion layer extended from the well region to the substrate.

3. A semiconductor integrated circuit as set forth in claim 1 wherein the width of said opening is 6 to 10 μm when the depth of the well region is 3 to 4 μm.

4. A semiconductor integrated circuit as set forth in claim 1 wherein the well region is biassed to ground voltage.

5. A semiconductor integrated circuit comprising a semiconductor substrate of a first conductivity type, a well region of a second conductivity type opposite to the conductivity type of the substrate, which is formed on the surface region of the substrate and a first insulated gate field effect transistor formed within the well region, wherein said well region has an opening exposed to the surface of said semiconductor substrate, the drain of said first insulated gate field effect transistor is connected to said semiconductor substrate through said opening, and said semiconductor substrate is connected to a power supply source wherein a highly doped region of the first conductivity type is formed as the drain of the first insulated gate field effect transistor on the surface region of the semiconductor substrate in the portion of said opening, wherein a junction-gate electric field transistor is constructed by said heavily doped region, said semiconductor substrate, the semiconductor substrate in the portion of said opening and said well region, which act as the source, drain, channel and gate, respectively.

6. A semiconductor integrated circuit comprising:
a semiconductor substrate of a first conductivity type;
a well region of a second conductivity type opposite to the conductivity type of the substrate, which is formed on the surface region of the substrate; and
a first insulated gate field effect transistor formed within the well region;
wherein said well region has an opening exposed to the surface of said semiconductor substrate, the drain of said first insulated gate field effect transistor is connected to said semiconductor substrate through said opening, and said semiconductor substrate is connected to a power supply source, wherein said drain is connected to the semiconductor substrate in the portion of said opening through a resistance composed of polycrystalline silicon, which is formed on an insulating film formed on the substrate, wherein said resistance composed of polycrystalline silicon includes a first low-resistivity region connected to said drain, a second low-resistivity region connected to the semiconductor substrate in the portion of said opening and a highresistivity region interposed between said first and second low-resistivity regions, wherein a heavily doped region of the first conductivity type is formed on the surface region of the semiconductor substrate in the portion of said opening and said second low-resistivity region is connected to said heavily doped region, and wherein a junction-gate field effect transistor is constructed by said heavily doped region, said semiconductor substrate, the semiconductor substrate in the portion of said opening and said well region, which act as the source, drain, channel and gate, respectively.

7. A semiconductor integrated circuit according to claim 5, wherein said opening portion has an impurity concentration which is lower than the impurity concentration of the well region.

8. A semiconductor integrated circuit according to claim 6, wherein said opening portion has an impurity concentration which is lower than the impurity concentration of the well region.

9. A semiconductor integrated circuit according to claim 5, wherein said well region is formed by selective impurity doping and said opening is formed by not subjecting a portion of the surface of said semiconductor substrate to said selective impurity doping.

10. A semiconductor integrated circuit according to claim 6, wherein said well region is formed by selective impurity doping and said opening is formed by not subjecting a portion of the surface of said semiconductor substrate to said selective impurity doping.

11. A semiconductor integrated circuit according to claim 5, wherein said circuit further comprises a plurality of said opening portions separated from one another by said well region.

12. A semiconductor integrated circuit according to claim 6, wherein said circuit further comprises a plurality of said opening portions separated from one another by said well region.

13. A semiconductor device comprising:
a semiconductor substrate of a first conductivity type;
a semiconductor region of a second conductivity type, opposite said first conductivity type, formed at a surface portion of said substrate and having an opening therein containing the material of said semiconductor substrate;
a MOS transistor formed within said semiconductor region and having a drain region; and
a junction-gate field effect transistor, having said substrate as its drain region formed in said opening, said junctiongate field effect transistor being connected to the drain region of said MOS transistor so as to connect the drain region of said MOS transistor to said substrate.

14. A semiconductor device according to claim 13, wherein said opening portion has an impurity concentration which is lower than the impurity concentration of the well region.

15. A semiconductor device according to claim 13, wherein said well region is formed by selective impurity doping and said opening is formed by not subjecting a portion of the surface of said semiconductor substrate to said selective impurity doping.

16. A semiconductor device according to claim 13, wherein said circuit further comprises a plurality of said opening portions separated from one another by said well region.

17. A semiconductor device according to claim 13, wherein said opening in said semiconductor region extends beneath the drain region of said MOS transistor.

* * * * *